United States Patent
Montez et al.

(10) Patent No.: US 9,458,010 B1
(45) Date of Patent: Oct. 4, 2016

(54) SYSTEMS AND METHODS FOR ANCHORING COMPONENTS IN MEMS SEMICONDUCTOR DEVICES

(71) Applicant: FREESCALE SEMICONDUCTOR, INC., Austin, TX (US)

(72) Inventors: Ruben B. Montez, Cedar Park, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/805,924

(22) Filed: Jul. 22, 2015

(51) Int. Cl.
*H01L 21/36* (2006.01)
*B81C 1/00* (2006.01)
*B81B 7/00* (2006.01)

(52) U.S. Cl.
CPC ......... *B81C 1/00039* (2013.01); *B81B 7/0029* (2013.01); *B81B 2203/0307* (2013.01); *B81C 2201/0197* (2013.01)

(58) Field of Classification Search
CPC ............... B81B 3/001; B81B 3/0005; B81B 2201/0221; B81B 2201/042; B81B 3/0018; B81C 2201/115; B81C 1/0096; B81C 2201/0107; B81C 2201/112; G01P 15/0802; G01P 2015/0814; G01P 15/124; G01P 15/131
See application file for complete search history.

(56) References Cited

U.S. PATENT DOCUMENTS

| | | | |
|---|---|---|---|
| 5,679,436 A * | 10/1997 | Zhao | B81B 3/001 361/280 |
| 8,592,998 B2 | 11/2013 | Claes et al. | |
| 2008/0026526 A1* | 1/2008 | Rao | H01L 21/28273 438/257 |
| 2014/0167189 A1* | 6/2014 | Steimle | B81B 3/0005 257/415 |
| 2016/0031698 A1* | 2/2016 | Steimle | B81B 3/001 257/418 |
| 2016/0141528 A1* | 5/2016 | Masuyama | G02B 5/1814 257/40 |

OTHER PUBLICATIONS

Jiang, et al., "Fabrication of Thick Silicon Dioxide Sacrificial and Isolation Blocks in a Slicon Substrate" (Journal of Micromechanics and Microengineering, 12 (2002) 87-95).

* cited by examiner

*Primary Examiner* — Robert Bachner

(57) ABSTRACT

A method of making a semiconductor device forms anchors for one or more layers of material. The method includes depositing a first layer of material on a substrate, applying a mask over the first layer of material to mask nanoparticle-sized areas of the first material, removing portions of the first layer of material to form a first set of recesses around the nanoparticle-sized areas of the first material, depositing a second layer of material in the recesses and over the nanoparticle-sized areas so that a second set of recesses is formed in a top surface of the second layer of material, and forming a component of the semiconductor device over the second layer of material. Material of a bottom surface of the component is included in the second set of recesses.

14 Claims, 6 Drawing Sheets

SYSTEMS AND METHODS FOR ANCHORING COMPONENTS IN MEMS SEMICONDUCTOR DEVICES

BACKGROUND

1. Field

This disclosure relates generally to semiconductor devices, and more specifically, to systems and methods for anchoring components in MEMS semiconductor devices.

2. Related Art

Micro-electro-mechanical-systems (MEMS) devices are finding more and more uses, especially for spatial sensing uses such accelerometers, position detectors, and gyroscopes. These functions are becoming more and more common and finding uses in many consumers devices such as mobile phones, automobiles, and electronic games. As the uses increase the demand for lower cost also increases which bears on having manufacturing processes that provide sufficient quality at high volume. MEMS devices typically include a portion that has some freedom of movement, often in 3 axes, that is critical to the functionality of the MEMS device. Integrating the process for making the movable feature(s) with processes for making other features in the device often presents difficulties.

Accordingly, there is a need to improve upon processes for making a MEMS device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The following describes embodiments of a method for fabricating a MEMS sensor device including structures having improved mechanical anchoring to help prevent the structures from becoming dislodged. The micro-recesses are formed under a polysilicon layer that is used to anchor components in a Microelectromechanical systems (MEMS) sensor. The micro-recesses can be formed by depositing a discontinuous film of nanoparticles using a material such as polysilicon, poly-germanium, polysilicon-germanium or other suitable material on an oxide or dielectric surface of a wafer. In other embodiments, a mask is used to that has nanoparticle-sized openings. The wafer is then exposed to an etchant to remove at least some of the dielectric that is not masked by the discontinuous film, or mask, to create the micro-recesses in the oxide. A layer of polysilicon or other suitable material is then deposited in the micro-recesses and over the discontinuous film. The material in the recesses anchors the deposited layer of polysilicon in the dielectric layer, thereby increasing the anchor strength for components formed in the polysilicon layer.

Embodiments of the below-described fabrication methods can be advantageously employed in the fabrication of various different types of MEMS sensor devices having inertial sensing structures anchored to underlying structures. By way of non-limiting illustration, an example of a first method suitable for fabricating a MEMS sensor is described below in conjunction with FIGS. 1-7, and an example of a second method suitable for fabricating a MEMS sensor is described below in conjunction with FIGS. 8-12. It is emphasized that embodiments of the below-described fabrication method can be utilized to produce a variety of MEMS sensor devices, including MEMS inertial sensors (e.g., accelerometers, gyroscopes, magnetometers, and so on), pressure sensors, and actuators.

FIGS. 1-7 are cross-sectional views of a MEMS accelerometer 100, as shown at various stages of manufacture and produced in accordance with a first exemplary embodiment of the present invention. As shown in FIGS. 1-7 and further below, MEMS accelerometer 100 is offered by way of non-limiting example only; it is emphasized that the below-described fabrication process can be utilized to produce MEMS devices other than accelerometers. Furthermore, the fabrication steps described below in conjunction with FIGS. 1-7 can be performed in alternative orders, certain steps may be omitted in alternative embodiments, and additional steps may be performed in alternative embodiments. Description of structures and processes known within the microelectronic device and semiconductor industries may be limited or omitted entirely without providing the well-known process details.

Figure 1:
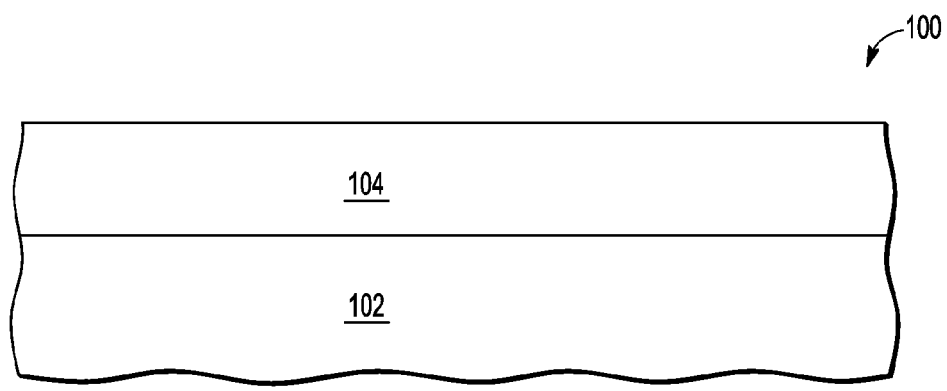
FIGS. 1-7 are cross-sectional views of a MEMS accelerometer, as shown at various stages of manufacture and produced in accordance with a first exemplary embodiment of the present invention.

With initial reference to FIG. 1, fabrication of MEMS accelerometer 100 commences with the provision of a substrate 102 that may be comprised of at least one semiconductor material and is preferably comprised of silicon. In one implementation, substrate 102 comprises a single crystal silicon substrate produced by singulation of a bulk silicon wafer. In an embodiment, multiple accelerometers simultaneously are fabricated on a bulk silicon wafer, and singulation occurs later in the process. However, for ease of illustration, the fabrication method depicted in conjunction with FIGS. 1-7 and 8-12 depict portions of a single device. In embodiments wherein substrate 102 is electrically conductive, dielectric layer 104 may be formed on the upper surface of substrate 102. Dielectric layer 104 is may be formed by growing an oxide over the upper surface of substrate 102; e.g., in an embodiment wherein substrate 102 comprises single crystal silicon, substrate 102 may be heated in an oxidizing ambient to grow a layer of silicon oxide thereof. For example, dielectric layer 104 may be formed by the chemical vapor deposition (CVD) or plasma enhanced vapor deposition (PECVD) of silicon dioxide. In one embodiment, dielectric layer 104 is grown to a thickness of about 2 microns (μm), although dielectric layer 104 may be thicker or thinner in other embodiments. Substrate 102 can be any semiconductor material or combinations of materials, such as gallium arsenide, silicon germanium, silicon-on-insulator (SOI), silicon, monocrystalline silicon, the like, and combinations of the above, as well as other types of non-semiconductor materials.

Figure 2:
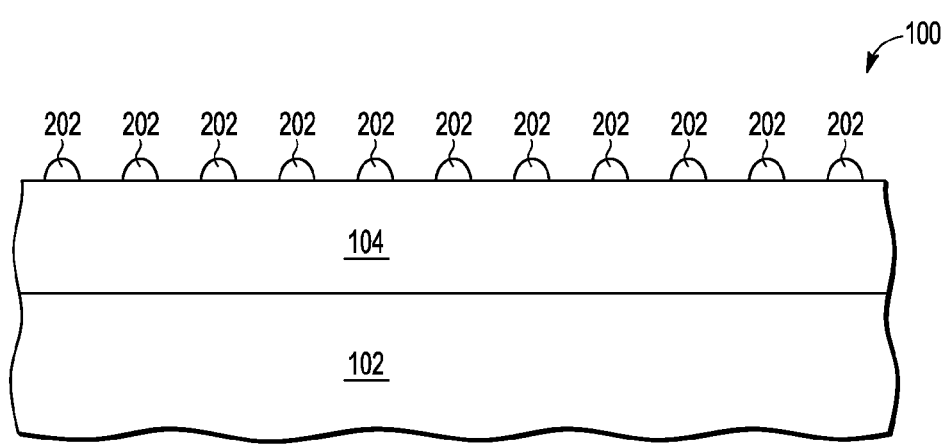

As illustrated in FIG. 2, a layer of nanoparticles 202 is then formed or deposited on dielectric layer 104. The deposition step can be performed using chemical vapor deposition (CVD), plasma enhanced chemical vapor deposition (PECVD), epitaxy (EPI) or other methods. In an embodiment, sensor 100 can be placed in a deposition chamber and a precursor gas flowed into the chamber to form a thin non-contiguous semiconductor layer on dielectric layer 104. For example, an amorphous or a polysilicon layer can be formed by flowing a silicon precursor gas, such as silane (SiH4) or disilane (Si2H6), for example, using a conventional CVD process. Deposition time will generally determine the thickness of the deposited layer. In an embodiment, for example, the height or thickness of the semiconductor layer (e.g., amorphous/polycrystalline silicon) can be about 3-20 nm.

At a subsequent stage of manufacture, the semiconductor layer is annealed to form nanoparticless 108 of desired shape and density. In an embodiment, the anneal of the semiconductor layer 201 can be performed in an ambient (e.g., one or more gases) that does not contain oxygen. For example, the ambient can be nitrogen, an inert gas (e.g., argon), hydrogen or a combination thereof. By way of example, an anneal of the semiconductor layer can be performed at a temperature of about 600° C. to 1000° C., for a time period of about 5 to 300 seconds in a hydrogen ambient.

Annealing the semiconductor layer results in the formation of a plurality of individual, discrete nanoparticles 202 of the semiconductor material which are dispersed over the surface of the insulating layer 104. The anneal causes the semiconductor (e.g., amorphous/polysilicon) layer to dewet from dielectric layer 104 and form nanoparticles 202 that are physically separated from each other. In some embodiments, for example, the nanoparticles 202 can have an average diameter, thickness or height of about 10-30 nm and be separated or spaced from one another by 10-30 nm. Nanoparticles 202 are generally uniformly distributed over the surface of the insulating layer 104, for example, at a density of about 1e11 to 3e11 nanoparticles per square centimeter. In some embodiments, polysilicon nanoparticles 202 can be LPCVD nucleated at 620° C. following their coalescence.

Figure 3:
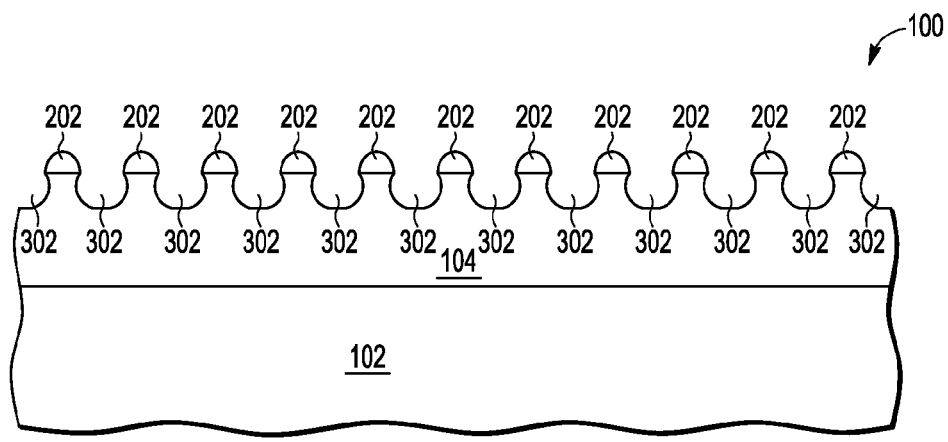

Referring now to FIG. 3, sensor device 100 is shown at a subsequent stage of manufacture during which device 100 is exposed to a liquid, dry, or vapor phase etch to form micro-recesses 302 in areas of dielectric layer 104 that are not protected or masked by nanoparticles 202. In some implementations, hydrofluoric acid can be used as the etchant when dielectric layer 104 is silicon dioxide and nanoparticles 202 are polysilicon, poly-germanium, poly-silicon-germanium, or other suitable material. The etching process may be isotropic to undercut nanoparticles 202 and provide additional anchoring support. That is, lateral dimensions of a subsequent layer of material deposited in micro-recesses will be larger than the opening at the interface between nanoparticles 202 and dielectric layer 104, thus preventing the subsequent layer from moving vertically or horizontally.

Figure 4:
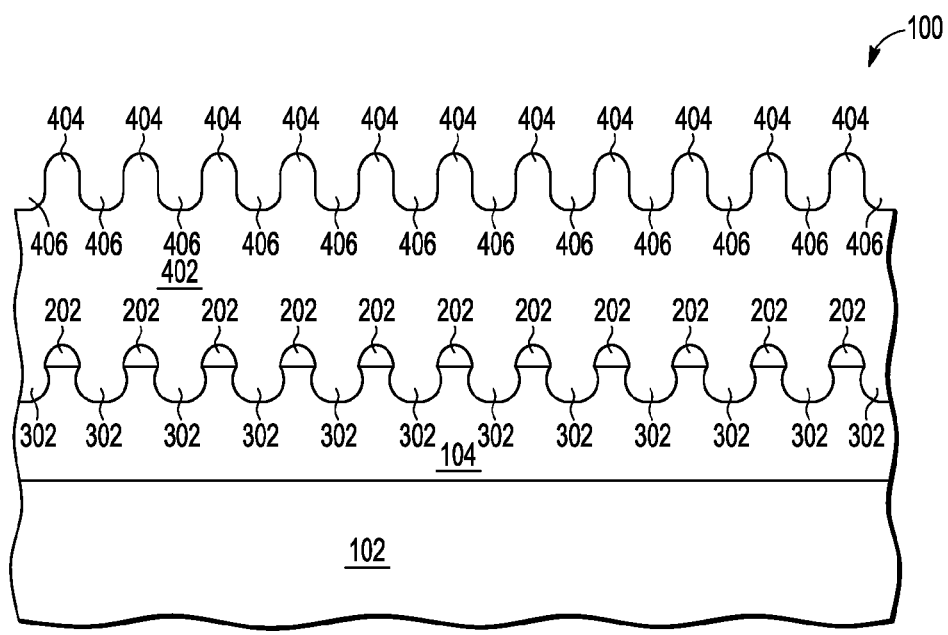

Referring to FIG. 4, sensor device 100 is shown at a subsequent stage of manufacture during which polysilicon layer 402 is conformally deposited over nanoparticles 202 and into micro-recesses 302. Polysilicon layer 402 may be deposited to a thickness of about 3000-6000 Angstroms in an embodiment, although the thickness of polysilicon layer 402 may vary amongst embodiments. As an inherent result of the conformal deposition process utilized to form polysilicon layer 402 taken in combination with the irregular surface topology of micro-recesses 302 and nanoparticles 202 over which polysilicon layer 402 has been deposited, polysilicon layer 402 is likewise imparted with non-planar or uneven geometry along its upper surface, shown as recessed portions 406 and raised portions 404 that coincide with respective micro-recesses 302 and nanoparticles 202.

Polysilicon layer 402 may function in a number of different roles in an accelerometer sensor. It may act as an electrical routing layer, as one of the electrical plates of a capacitive structure, or as part of a structural anchor for subsequent layers. The modification of the attachment of the polysilicon layer 402 to the underlying structure as disclosed herein improves the function of the polysilicon layer 402 as a structural anchor.

Figure 5:
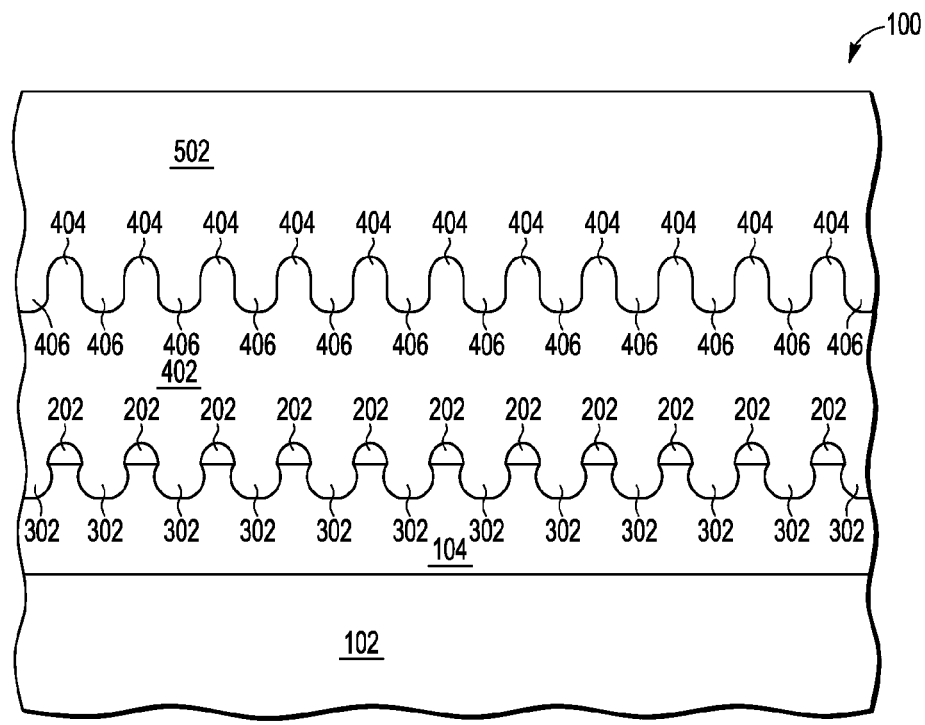

After deposition of polysilicon layer 402, a layer or body of sacrificial material 502 (referred to herein as "sacrificial body 502") is then deposited over substrate 102 and, specifically, onto polysilicon layer 402 to produce the device 100 shown in FIG. 5. Sacrificial body 502 may be formed by the deposition of any material amenable to subsequent removal. A wet etchant such as hydrofluoric acid or a gaseous etchant such as hydrofluoric acid in a vapor form can be used to remove sacrificial material 502 at a later stage in the fabrication of the accelerometer sensor. Sacrificial body 502 acts as a scaffolding or mold material during the construction of the accelerometer and the removal of this material allows the free motion of portions of the accelerometer when it is subject to inertial forces. In one embodiment, sacrificial body 502 is formed by deposition of a phosphosilicate glass (PSG), which can be subsequently removed utilizing a hydrogen fluoride (HF) etch chemistry. Other materials suitable for formation of sacrificial body 502 include, but are not limited to, un-doped silicon oxide such as deposited using tetraethyl orthosilicate as a precursor in a chemical vapor deposition system or boron phosphosilicate glass (BPSG). By way of non-limiting example, sacrificial body 502 may be deposited to a thickness of about 1.8 μm, although sacrificial body 502 may be thicker or thinner in other embodiments. The top surface of sacrificial body 502 may be irregular but may or may not be planarized using a method such as chemical mechanical polishing or other suitable method.

Figure 6:
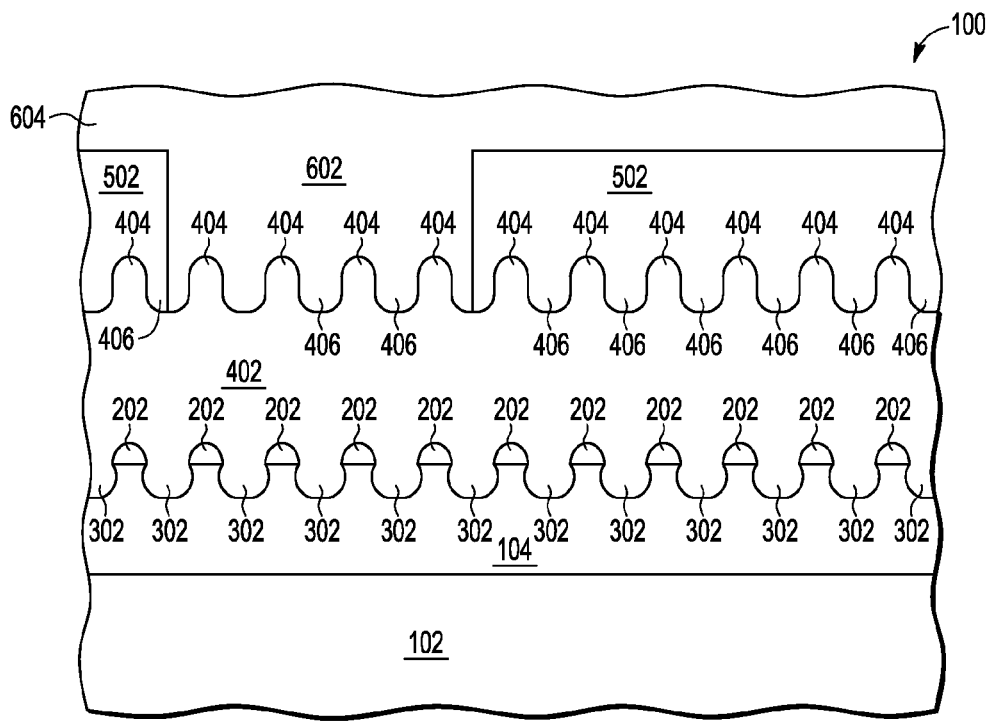

Referring to FIG. 6, sacrificial body 502 is patterned and etched to create an opening in sacrificial body 502. The opening extends completely through sacrificial body 502 to expose a portion of polysilicon layer 402, including raised portions 404 and recessed portions 406. This opening will be used to form electrical or structural connections. A second polysilicon layer is then deposited to form a transducer layer 604, with the portion of transducer layer 604 in the opening in the sacrificial body 502 forming an anchor portion 602 that fills recessed portions 406 of polysilicon layer 402. Transducer layer 604 thus resists being dislodged vertically and horizontally due to the bottom surface of anchor portion 602 filling and being retained in isotropically etched recessed portions 406. The thickness of the second polysilicon layer for transducer layer 604 may range from about 10-40 μm in some embodiments, although the thickness of polysilicon layer 604 may vary amongst embodiments.

Figure 7:
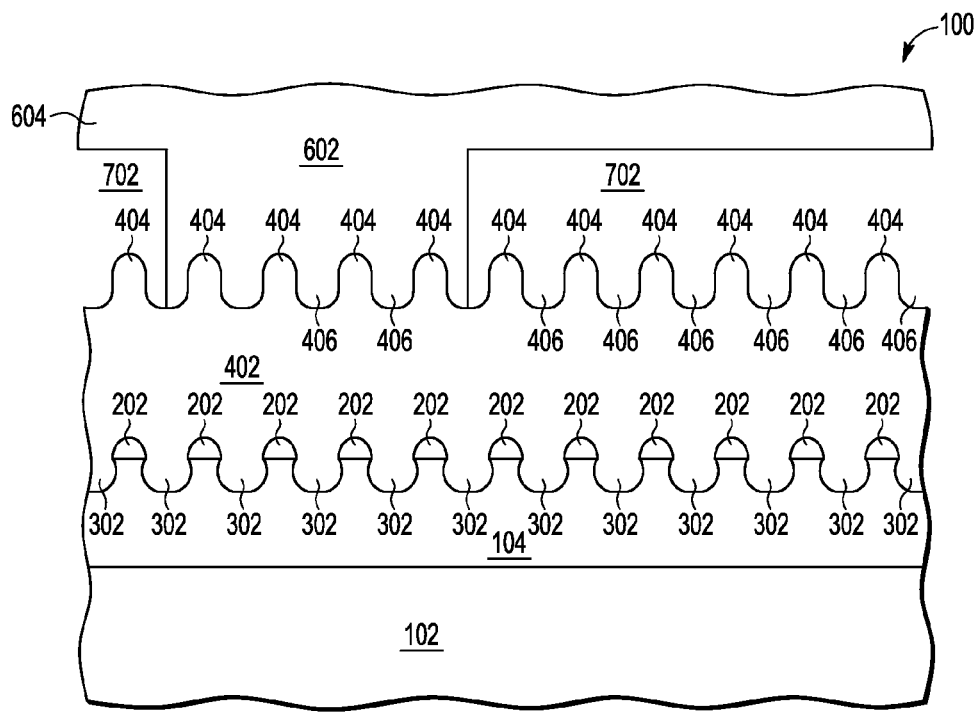

Transducer layer 604 may be planarized by a chemical mechanical planarization (CMP) process after deposition to smooth roughness of the polysilicon layer 604. Subsequent to the planarization process other layers such as an aluminum metal layer (not shown) to be used for functional electrical connections may be patterned. Portions of the transducer layer 604 can be etched away using a deep reactive ion etch process in order to form mechanical springs, release holes to facilitate the removal of sacrificial body 502, or to form electromechanical drive elements or electrical sensing elements. After etching of portions of transducer layer 604, sacrificial body 502 is removed through wet or gaseous etch reactants. Sacrificial body 502 is then replaced by void layer 702 which may define an air gap of a capacitor or may provide a space to permit the functioning of device 100 as an accelerometer or inertial sensor, as shown in FIG. 7. Additional processing steps may then be utilized to complete fabrication and/or packaging of sensor device 100, as conventionally known. These may include capping of the sensor in sealed hermetic cavities and dicing or singulating the wafer into the functional die. Further, other intermediate processing steps not disclosed herein may be included during the fabrication of sensor device 100 to create other components, such as sensing electrodes in sensor device 100 and conductive lines that connect the sensing electrodes to other circuitry external to sensor device 100.

FIGS. 8-12 are cross-sectional views of a MEMS accelerometer 800, as shown at various stages of manufacture and produced in accordance with a second exemplary embodiment of the present invention.

Figure 8:
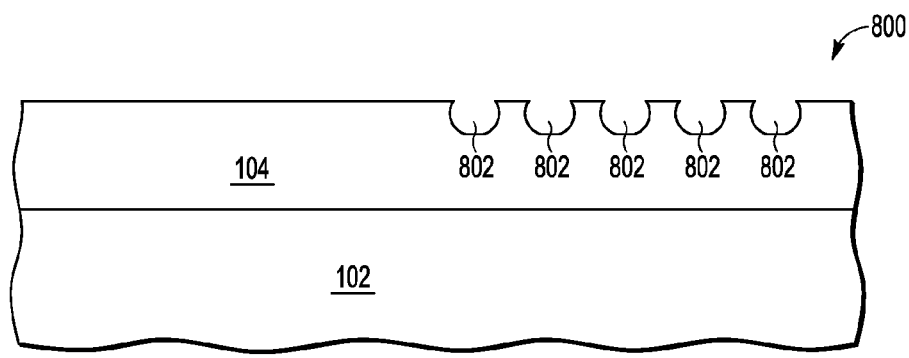
FIGS. 8-12 are cross-sectional views of a MEMS accelerometer, as shown at various stages of manufacture and produced in accordance with a second exemplary embodiment of the present invention.

With reference to FIG. 8, fabrication of MEMS accelerometer 800 commences with the provision of a substrate 102 and dielectric layer 104, similar to those described in connection with sensor device 100 of FIG. 1. A patterned mask (not shown) is then imprinted on dielectric layer 104 and a liquid, vapor, or dry etch is performed to remove portions of dielectric layer 104 that are not covered by the mask. In some embodiments, for example, micro-recesses 802 can have an average diameter, thickness or height of about 100 nm and be separated or spaced from one another by 100 nm. Micro-recesses 802 are generally uniformly distributed over the surface of the insulating layer 104, for example, at a density of about 1e10 micro-recesses 802 per square centimeter.

In some implementations, hydrofluoric acid can be used as the etchant when dielectric layer 104 is silicon dioxide. The etching process may be isotropic to undercut the top surface of dielectric layer 104 and provide additional anchoring support. That is, lateral dimensions of a subsequent layer of material deposited in micro-recesses 802 will be larger than the opening at the top surface of dielectric layer 104, thus preventing the subsequent layer from moving vertically or horizontally.

Figure 9:
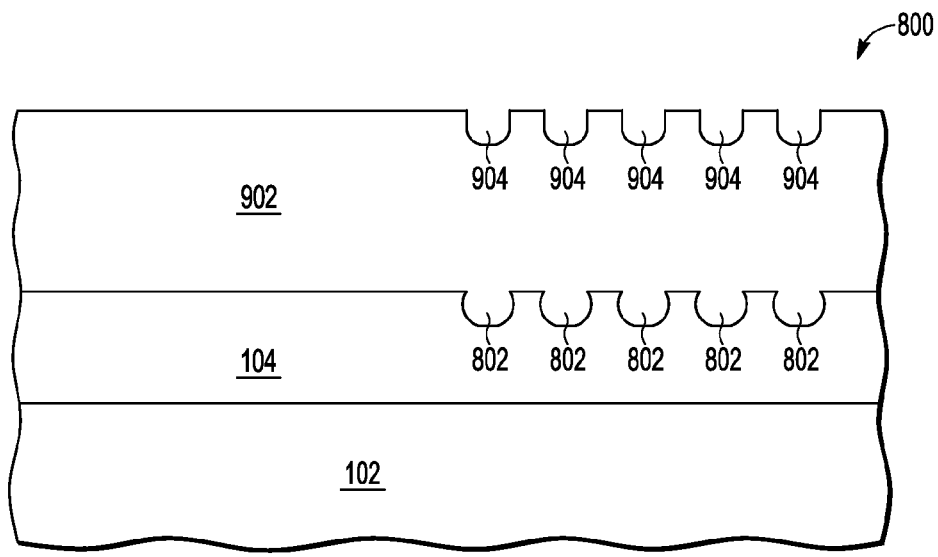

Referring to FIG. 9, sensor device 800 is shown at a subsequent stage of manufacture during which polysilicon layer 902 is conformally deposited over nanoparticles 202 and into micro-recesses 802. Polysilicon layer 902 may be deposited to a thickness of about 3000-6000 Angstroms in an embodiment, although the thickness of polysilicon layer 902 may vary amongst embodiments. As an inherent result of the conformal deposition process utilized to form polysilicon layer 902 taken in combination with the irregular surface topology of dielectric layer 104 over which polysilicon layer 902 has been deposited, polysilicon layer 902 is likewise imparted with non-planar or uneven geometry along its upper surface, shown as recessed portions 904 that coincide with respective micro-recesses 802.

Polysilicon layer 902 may function in a number of different roles in an accelerometer sensor, such as an electrical routing layer, as one of the electrical plates of a capacitive structure, and/or as part of a structural anchor for subsequent layers. The manner of attaching polysilicon layer 902 as disclosed herein improves the function of polysilicon layer 902 as a structural anchor.

Figure 10:
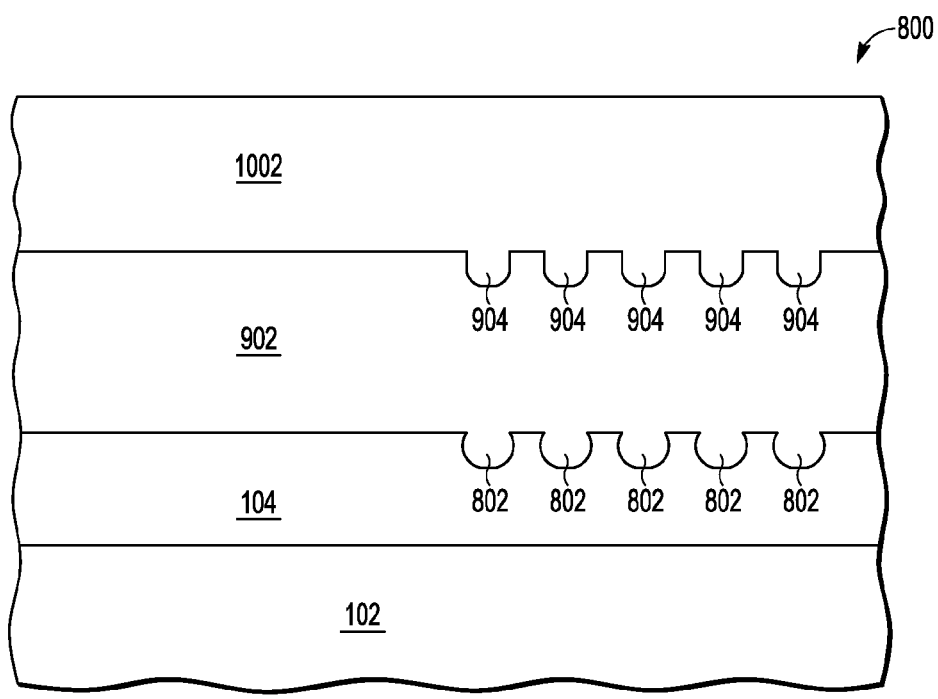

After deposition of polysilicon layer 902, a layer or body of sacrificial material 1002 (referred to herein as "sacrificial body 1002") is then deposited over substrate 102 and, specifically, onto polysilicon layer 902 to produce the device 800 shown in FIG. 10. Sacrificial body 1002 may be formed by the deposition of any material amenable to subsequent removal. A wet etchant such as hydrofluoric acid or a gaseous etchant such as hydrofluoric acid in a vapor form can be used to remove sacrificial material 1002 at a later stage in the fabrication of the accelerometer sensor. Sacrificial body 1002 acts as a scaffolding or mold material during the construction of the accelerometer and the removal of sacrificial body 1002 allows the free motion of portions of the accelerometer when it is subject to inertial forces. In one embodiment, sacrificial body 1002 is formed by deposition of a phosphosilicate glass (PSG), which can be subsequently removed utilizing a hydrogen fluoride (HF) etch chemistry. Other materials suitable for formation of sacrificial body 1002 include, but are not limited to, undoped silicon oxide such as deposited using tetraethyl orthosilicate as a precursor in a chemical vapor deposition system or boron phosphosilicate glass (BPSG). By way of non-limiting example, sacrificial body 1002 may be deposited to a thickness of about 1.8 µm, although sacrificial body 1002 may be thicker or thinner in other embodiments.

Figure 11:
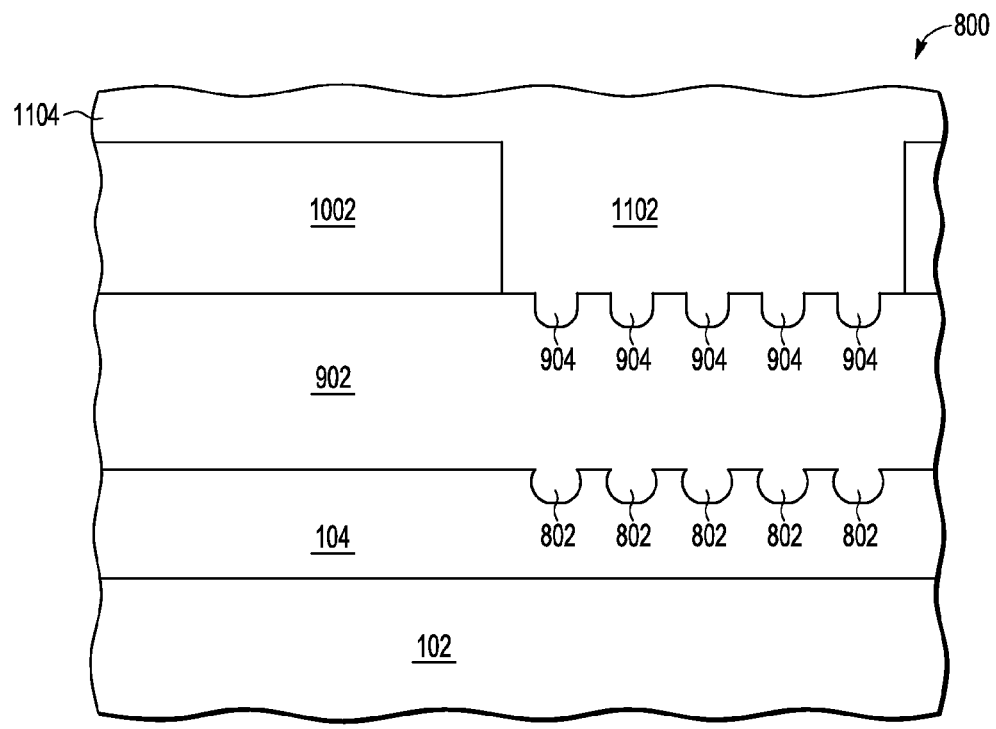

Referring to FIG. 11, sacrificial body 1002 is patterned and etched to create an opening in sacrificial body 1002. The opening extends completely through sacrificial body 1002 to expose a portion of polysilicon layer 902, including recessed portions 904. The opening can be used to form electrical or structural connections. A second polysilicon layer is then deposited to form a transducer layer 1104, with the portion of transducer layer 1104 in the opening in the sacrificial body 1002 forming an anchor portion 1102 that fills recessed portions 904 of polysilicon layer 902. Transducer layer 1104 thus resists being dislodged vertically and horizontally due to the bottom surface of anchor portion 1102 filling and being retained in isotropically etched recessed portions 904. The thickness of the second polysilicon layer for transducer layer 1104 may range from about 10-40 µm in an embodiment, although the thickness of transducer layer 1104 may vary amongst embodiments.

Figure 12:
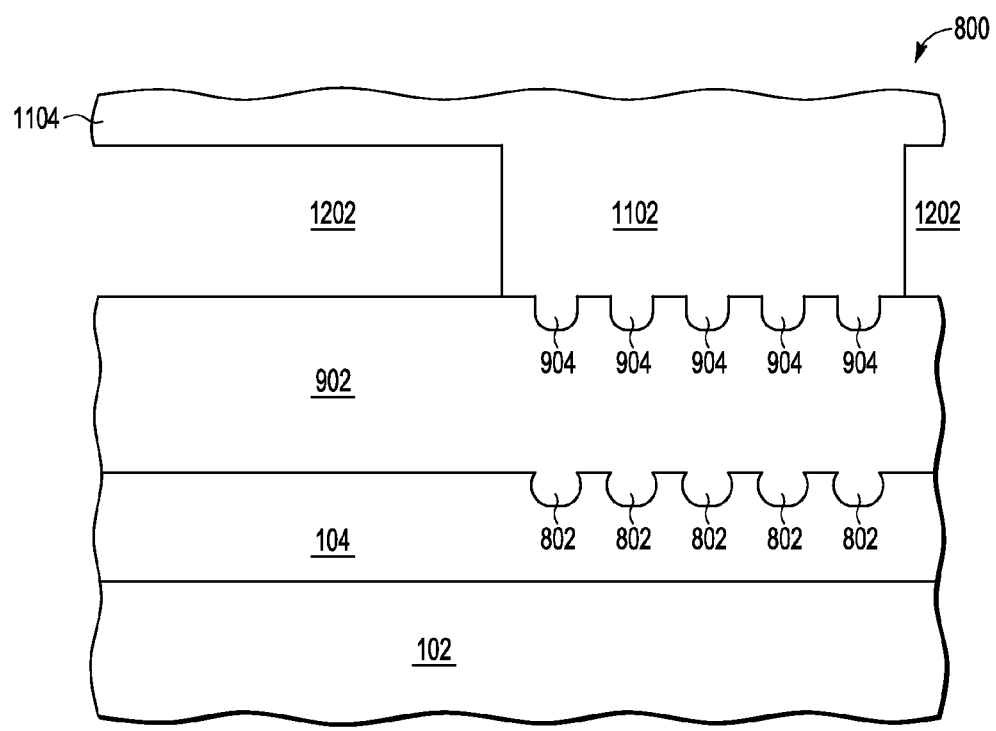

Transducer layer 1104 may be planarized using a chemical mechanical planarization (CMP) process after deposition to smooth surface roughness. Subsequent to the planarization process other layers such as an aluminum metal layer (not shown) to be used for functional electrical connections may be patterned. Portions of the transducer layer 1104 can be etched away using a deep reactive ion etch process in order to form mechanical springs, release holes to facilitate the removal of sacrificial body 1002, and to form electromechanical drive elements or electrical sensing elements. After etching portions of transducer layer 1104, sacrificial body 1002 is removed through wet or gaseous etch reactants. Sacrificial body 1002 is then replaced by void layer 1202 which may define an air gap of a capacitor or provide a space to permit the functioning of the device 800 as an accelerometer or inertial sensor as shown in FIG. 12. Additional processing steps may then be utilized to complete fabrication and/or packaging of sensor device 800, as conventionally known. These may include capping of the sensor in sealed hermetic cavities and dicing or singulating the wafer into the functional die. Further, other intermediate processing steps not disclosed herein may be included during the fabrication of sensor device 800 to create other components, such as sensing electrodes in sensor device 800 and conductive lines that connect the sensing electrodes to other circuitry external to sensor device 800.

By now it should be appreciated that in some embodiments, there has been provided a method of making a semiconductor device (100 that includes depositing a first layer of material (104) on a substrate, applying a mask (108) over the first layer of material to mask nanoparticle-sized areas of the first material, removing portions of the first layer of material to form a first set of recesses (302, 802) around the nanoparticle-sized areas of the first material, depositing a second layer of material (402, 1002) in the recesses and over the nanoparticle-sized areas so that a second set of recesses (406, 904) is formed in a top surface of the second layer of material, and forming a component (602, 1102) of the semiconductor device over the second layer of material, wherein material of a bottom surface of the component is included in the second set of recesses.

In another aspect, the mask is applied by depositing nanoclusters (108) on a top surface of the first layer of material, the nanoclusters forming the nanoparticle-sized areas.

In another aspect, the method can further comprise removing the mask before depositing the second layer of material (FIG. 8).

In another aspect, removing portions of the first layer of material includes etching the first layer of material.

In another aspect, the second layer of material is deposited over the nanoclusters as well as in the recesses.

In another aspect, the semiconductor device is a microelectrical mechanical sensor (MEMS).

In another aspect, the depositing the second layer of material includes conformally depositing the second layer of material, and at least a portion of the first layer of material is an anchor pad for a corresponding portion of the second layer of material.

In another aspect, at least a portion of the second layer of material is an anchor pad for the component.

In another aspect, the nanoclusters are one of a group consisting of polysilicon, poly-germanium, and poly-silicon-germanium.

In another aspect, the first layer of material is an oxide.

In another aspect, the second layer of material is polysilicon.

In other embodiments, a semiconductor device (100, 200) can comprise a substrate (102), a first layer of material (104) on the substrate, a plurality of discontinuous nanoparticles (108) on the first layer of material in which the nanoparticles form a mask on a top surface of the first layer, a first set of recesses (302) formed in areas of the top surface of the first layer that are devoid of the nanoparticles, a second layer of material (402, 902) applied over the nanoparticles and in the first set of recesses, a top surface of the second layer of material including a second set of recesses, and a component (602, 1102) on the second layer of the material, wherein a bottom surface of the component fills at least some recesses of the second set of recesses.

In another aspect, a portion of the first material is removed under at least some of the nanoparticles.

In another aspect, depth of the recesses is ten percent or less of a thickness of the component.

In another aspect, the first layer of material is an oxide and the second layer of material is polysilicon.

In another aspect, the nanoparticles are one of a group consisting of polysilicon, poly-germanium, and poly-silicon-germanium.

In another aspect, the semiconductor device is a microelectrical mechanical sensor (MEMS).

In another embodiment, a method of making a micro electrical-mechanical sensor (MEMS) device can comprise depositing a first layer of material (104) on a substrate; forming a plurality of discontinuous nanoparticles (108) on the first layer of material, wherein the nanoparticles form a mask on a top surface of the first layer; etching a first set of recesses (302) in areas of the top surface of the first layer that are devoid of the nanoparticles; depositing a second layer of material (402, 902) over the nanoparticles and in the first set of recesses, a top surface of the second layer of material including a second set of recesses; and forming a component (602, 1102) on the second layer of the material, wherein a bottom surface of the component fills at least some recesses of the second set of recesses.

In another aspect, the method can further comprise etching the first layer of material until at least some of the recesses in the first set of recesses undercut the nanoparticles.

In another aspect, depths of at least some of the first set of recesses range from 200 to 400 Angstroms.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device, comprising:
 depositing a first layer of material on a substrate;
 applying a mask over the first layer of material to mask nanoparticle-sized areas of the first material;

removing portions of the first layer of material to form a first set of recesses around the nanoparticle-sized areas of the first material;

depositing a second layer of material in the recesses and over the nanoparticle-sized areas so that a second set of recesses is formed in a top surface of the second layer of material; and forming a component of the semiconductor device over the second layer of material, wherein material of a bottom surface of the component is included in the second set of recesses.

2. The method of claim 1, wherein
the mask is applied by depositing nanoclusters on a top surface of the first layer of material, the nanoclusters forming the nanoparticle-sized areas.

3. The method of claim 1, further comprising:
removing the mask before depositing the second layer of material.

4. The method of claim 1, wherein the removing portions of the first layer of material includes etching the first layer of material.

5. The method of claim 2, wherein the second layer of material is deposited over the nanoclusters as well as in the recesses.

6. The method of claim 1, wherein the semiconductor device is a micro-electrical mechanical sensor (MEMS).

7. The method of claim 6, wherein the depositing the second layer of material includes conformally depositing the second layer of material, and at least a portion of the first layer of material is an anchor pad for a corresponding portion of the second layer of material.

8. The method of claim 6, wherein at least a portion of the second layer of material is an anchor pad for the component.

9. The method of claim 2, wherein
the nanoclusters are one of a group consisting of poly-silicon, poly-germanium, and poly-silicon-germanium.

10. The method of claim 1, wherein
the first layer of material is an oxide.

11. The method of claim 2, wherein
the second layer of material is polysilicon.

12. A method of making a micro electrical-mechanical sensor (MEMS) device comprising:

depositing a first layer of material on a substrate;

forming a plurality of discontinuous nanoparticles on the first layer of material, wherein the nanoparticles form a mask on a top surface of the first layer;

etching a first set of recesses in areas of the top surface of the first layer that are devoid of the nanoparticles;

depositing a second layer of material over the nanoparticles and in the first set of recesses, a top surface of the second layer of material including a second set of recesses;

forming a component on the second layer of the material, wherein a bottom surface of the component fills at least some recesses of the second set of recesses.

13. The method of claim 12, further comprising etching the first layer of material until at least some of the recesses in the first set of recesses undercut the nanoparticles.

14. The method of claim 13, wherein depths of at least some of the first set of recesses range from 200 to 400 Angstroms.

* * * * *